United States Patent [19]

Higashi et al.

[11] 3,872,490

[45] Mar. 18, 1975

[54] MECHANICAL - ELECTRICAL SEMICONDUCTOR TRANSDUCER WITH RECTIFYING TIN OXIDE JUNCTION

[75] Inventors: Kazuhiro Higashi, Takatsuki; Isao Taguchi; Nobuaki Miura, both of Kyoto, all of Japan

[73] Assignee: Omron Tateisi Electronics Co., Kyoto, Japan

[22] Filed: Feb. 26, 1971

[21] Appl. No.: 119,337

[30] Foreign Application Priority Data

Nov. 16, 1970 Japan .............................. 45-114087
Jan. 20, 1971 Japan .................................. 46-1515

[52] U.S. Cl. .......................... 357/15, 357/26, 357/29
[51] Int. Cl. .......................... H01l 11/00, H01l 15/00
[58] Field of Search... 317/234, 26 M, 235 U, 235 N, 317/235 A; 313/108 D

[56] References Cited

UNITED STATES PATENTS

| | | | |
|---|---|---|---|
| 3,319,140 | 5/1967 | Toussaint et al. | 317/235 |
| 3,330,983 | 7/1967 | Cusano et al. | 313/108 D |
| 3,365,630 | 1/1968 | Logan et al. | 317/235 UA |
| 3,381,182 | 4/1968 | Thornton | 317/234 |
| 3,394,085 | 7/1968 | Westerveid et al. | 317/234 |
| 3,416,044 | 12/1968 | Dreyfus et al. | 313/108 D |
| 3,451,912 | 6/1969 | D'Heurle et al. | 317/235 UA |
| 3,508,125 | 4/1970 | Ertei et al. | 317/235 |
| 3,518,508 | 6/1970 | Yamashita et al. | 317/235 |
| 3,566,217 | 2/1971 | Cooper | 317/235 |
| 3,596,151 | 7/1971 | Eldridge | 317/235 |
| 3,598,997 | 8/1971 | Baertsch | 317/235 |
| 3,679,949 | 7/1972 | Uekusa et al. | 317/238 |

FOREIGN PATENTS OR APPLICATIONS

| | | | |
|---|---|---|---|
| 7,108 | 9/1966 | Japan | 317/235 |

OTHER PUBLICATIONS

Schottky barrier devices, by Matsushita; Electronic International, Sept. 15, 1969.

*Primary Examiner*—Andrew J. James

[57] ABSTRACT

A semiconductive mechanical-electrical transducer is obtained by providing a mechanical force applying means on a semiconductor composite comprising a tin oxide film deposited on a semiconductor substrate and having a barrier having a rectifying characteristic therebetween.

Preferably the main surface of the substrate comprises a projection, at a top of which is deposited an insulation layer, and the tin oxide film is deposited on the main surface of the substrate, whereby the barrier having a rectifying characteristic is formed in a bevel portion of the projection. It was discovered that in such an embodiment the shearing stress is applied to the barrier, when the mechanical force is applied to the composite, in which case the conversion efficiency of the energy is enhanced as compared with a case where the main surface is a plane surface.

25 Claims, 12 Drawing Figures

INVENTORS
KAZUHIRO HIGASHI
ISAO TAGUCHI
NOBUAKI MUIRA
BY: Irons, Sears, Staas, Halsey & Santorelli
ATTORNEYS

MECHANICAL - ELECTRICAL SEMICONDUCTOR TRANSDUCER WITH RECTIFYING TIN OXIDE JUNCTION

BACKGROUND OF THE INVENTION

1. Field of the Invention

This invention relates to a semiconductive transducer. More specifically, this invention relates to an improvement in a semiconductive mechanical-electrical transducer.

2. Description of the Prior Art

Various types of semiconductive mechanical-electrical transdusers or semiconductive pressure sensitive transducers have been proposed and put to practical use. The typical one of such transducers uses a semiconductor P–N junction. The semiconductor device, typically made of silicon, having a P–N junction undergoes a change of the electrical characteristics of the junction, when a mechanical force or pressure is applied to the P–N junction. It is, therefore, possible to implement a pressure sensitive device by providing a means for applying pressure to the P–N junction of a semiconductor device having such junction.

One of the problems of the conventional pressure sensitive transducers employing P–N junction is their low sensitivity. For this reason, it is necessary to combine such transducer with an active device such as transistor, when it is put to practical use. Another great problem is poor linearity of the electrical characteristic, this limiting the application of such a transducer. Further, as well known, semiconductor devices employing P–N junction call for processing at a high temperature in the process of manufacture, this making the manufacturing process complicated and the cost higher.

As a transducer of another type was proposed a device employing a Schottky barrier formed between a semiconductor layer and a metal layer. One of the problems encountered in connection with this type of transducer is that the barrier is subject to damage when a mechanical force or pressure is applied to the metal layer, since the metal layer is soft.

Several Japanese applications for patent, previously filed by the same applicant as that of the corresponding Japanese applications for the present invention, disclose a semiconductor composite comprising a film of tin oxide ($SnO_2$) deposited on a semiconductor substrate such as silicon and having rectifying and photoelectric characteristics therebetween.

More particularly, such a composite is obtained by a process comprising the steps of heating an N-type silicon single crystal substrate in a quartz tube, introducing the vapor of a tin salt such as dimethyl tin dichloride ( $(CH_3)_2SnCl_2$) into said quartz tube and having a tin oxide film deposited on said silicon substrate by pyrolysis. It was confirmed that between the tin oxide film and the silicon substrate of the composite thus obtained is formed a barrier which, being presumably a Schottky barrier, closely resembles a P–N junction in a rectifying characteristic. Such barrier may be advantageously utilized as a rectifying device or photoelectromotive force device.

As is well known, the tin oxide film is transparent and conductive. Hense, by so adapting the composite that light is applied to said barrier through the tin oxide film, a photoelectric device is provided. It has been observed that the spectral characteristic of such photoelectric device is such that it is more highly sensitive in the visible wavelength region as compared with a conventional silicon photoelectric device. It also exhibits a higher output at lower illumination, and is satisfactory in temperature characteristic and response characteristics.

The structure, characteristics, applications and manufacturing methods of the abovementioned $SnO_2$-semiconductor composite are described in more detail in the following Japanese patent applications filed by the same applicants of this application: "Photocell," filed Apr. 9, 1969, application Ser. No. 27,545/1969; "Photoelectric Device and Method of Making," filed Aug. 7, 1969, application Ser. No. 62,728/1969; "Method of Manufacturing Integrated Photoelectric Device," filed Aug. 7, 1969, application Ser. No. 62,730/1969; "Method of Manufacturing Transparent Conductive Film," filed Aug. 7, 1969, application Ser. No. 62,733/1969, "Method of Manufacturing Semiconductor Device," filed Sept. 24, 1969, application Ser. No. 76,483/1969; "Semiconductor Photoelectric Device and Method of Making," filed Sept. 26, 1969, application Ser. No. 77,192/1969; and "Method of Manufacturing Semiconductor Device," filed Oct. 2, 1969, application Ser. No. 79,098/1969.

In view of the fact that such composite exhibits a favorable rectifying characteristic, it might be possible to apply the composite as a pressure sensitive device.

SUMMARY OF THE INVENTION

Briefly stated, the present invention provides a semiconductive mechanical-electrical transducer comprising a semiconductor composite including a film of tin oxide deposited on a semiconductor substrate and having a rectifying characteristic therebetween and a means for applying mechanical force to said composite. It was discovered that such composite comprising a tin oxide film deposited on a semiconductor substrate shows a change in the electrical characteristic, when mechanical force is applied to the composite. More specifically, the backward, i.e., reverse current of the composite is linearly proportional to the mechanical force applied to the composite.

The present invention also provides an improvement in such transducer, wherein pressure sensitivity is enhanced. This can be accomplished by employing such structure that a mechanical force is applied so as to give rise to a shearing stress in the barrier portion. In accordance with an embodiment employing such an improvement, a tin oxide layer is deposited on a rough or uneven surface or a surface having small irregularities of a semiconductor substrate. Accordingly, the interface or barrier formed therebetween has corresponding irregularities or unevenness. When the mechanical force is applied to a given area of the tin oxide layer, there occurs a shearing stress in the interface or barrier of a bevel portion. It was discovered that, when the barrier portion is thus subjected to shearing stress, higher pressure sensitivity is obtained as compared with a case where the mechanical force is applied vertically to the barrier or the barrier portion is subjected to compressive stress.

Therefore, an object of the present invention is to provide a semiconductor pressure sensitive device having an excellent pressure sensitive characteristic.

Another object of the present invention is to provide a semiconductor pressure sensitive device on which a means for applying pressure can be provided with ease.

Still another object of the present invention is to provide a semiconductor pressure sensitive device which is simple in construction and easy to manufacture.

A further object of the present invention is to provide a semiconductor pressure sensitive device which can be manufactured at a relatively low temperature.

Still a further object of the present invention is to provide a semiconductor pressure sensitive device which can be manufactured at a relatively low cost.

A further object of the present invention is to provide a pressure sensitive device employing a semiconductor composite which comprises a semiconductor substrate and a tin oxide layer deposited thereon with a barrier having a rectifying characteristic formed therebetween.

Still a further object of the present invention is to improve the pressure sensitive characteristic of the pressure sensitive device employing a semiconductor composite comprising a tin oxide layer deposited on a semiconductor substrate.

These objects and other objects and features of the present invention will become apparent from the following detailed description of the preferred embodiments taken in conjunction with the accompanying drawings.

BRIEF DESCRIPTION OF THE DRAWINGS

In all these figures like numerals designate like parts.

DESCRIPTION OF THE PREFERRED EMBODIMENTS

Figure 1:
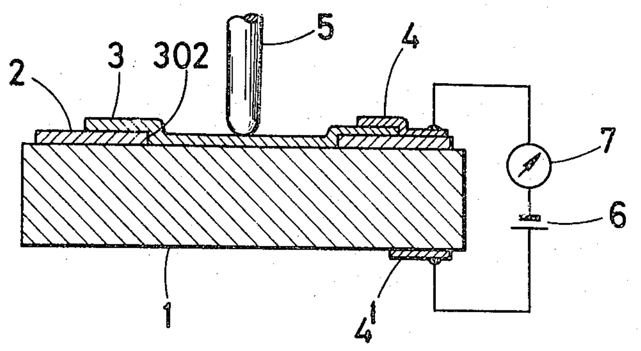
FIG. 1 is a sectional view of a semiconductive transducer in accordance with the present invention.

Referring to FIG. 1, there is shown a schematic sectional view of the mechanical-electrical transducer of an embodiment in accordance with the present invention. The transducer shown basically comprises a semiconductor composite and a pressure applying means provided thereon.

This composite comprises, for example, an N-type silicon substrate 1 whose specific resistivity is about 1 ohm·cm, and a tin oxide ($SnO_2$) film 2 deposited on the upper surface thereof through pyrolysis of a tin salt such as dimethyl tin dichloride. The $SnO_2$ film 2 contained in the composite in accordance with the present invention shall be so selected that it exhibits high conductivity and itself constitutes an N-type semiconductor. Such conductivity shall be close to that of a metal or about $10^{20}$atoms/cm$^3$ in terms of free electron concentration. The $SnO_2$ layer, having the properties of an N-type semiconductor, can be formed by a rapid chemical reaction yeilding $SnO_2$. This result is presumably accounted for by the excess of metal (shortage of oxygen) resulting from the rapidity of such reaction.

It was discovered that the composite of such structure and composition has a rectifying characteristic and also exhibits a photoelectric effect when radiation energy is applied to the heterojunction formed inside such composite. One of the possible interpretations of the discovery is that, $SnO_2$ regarded as metal, this heterojunction behaves as a Schottky barrier formed between $SnO_2$ film and the semiconductor substrate.

Figure 2:
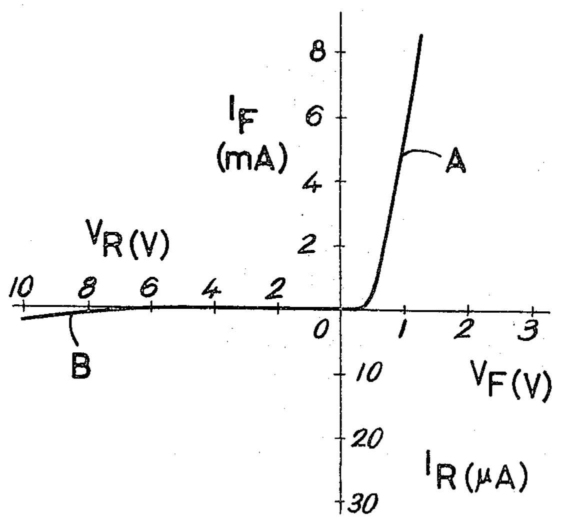
FIG. 2 is a graph showing the rectifying characteristic of the semiconductor composite included in the transducer of FIG. 1.

Referring to FIG. 2, there is shown the rectifying characteristic of the semiconductor composite of FIG. 1. In the graph. Curve A shows a positive or forward characteristic of such composite, while Curve B shows a negative or backward i.e., reverse, characteristic of the composite.

Referring again to FIG. 1, detailed structure of the transducer and a manufacturing process thereof will be described. There is formed a film of insulating material 2 such as of $SiO_2$ on a main surface of an N-type silicon single crystal substrate 1 with specific resistivity of about 1 ohm·cm to thickness of 8,000 A. Said semiconductor substrate 1 can either be a combination of an N-type layer of high specific resistivity deposited on another N-type layer of low specific resistivity or an N-type layer deposited all over or partially on a P-type layer. Said $SiO_2$ film 2 can be formed by either a known method of thermal reaction or pyrolysis of silane at a relatively low temperature. Such method of forming an electrically insulating film is well known to those skilled in the art.

Film of any other insulating material can be used in place of said $SiO_2$ film. Other such insulating materials are for example, silicon nitride ($Si_3N_4$), lead glass ($SiO_2$—PbO), and almina glass ($SiO_2$—$Al_2O_3$). The insulating film 2 is preferably formed at a relatively low temperature, preferably at a temperature not exceeding about 900°C. Heating at an extremely high temperature calls for a more expensive apparatus, but such high temperatures increase the risk of damage to the semiconductor substrate.

Then, a part of the insulating film 2 is removed by photoetching in a circular form, for example, providing an opening 302. It is also possible to have the insulating film 2 deposited in such a manner that such opening 302 is formed already at this stage. However, by first forming an insulating film of uniform thickness all over the main surface of the substrate and then removing the unnecessary part by the photo-etching method, the desired pattern with higher precision can be obtained. Film of $SiO_2$, $SiO_2$—PbO, etc., can be processed by the photo-etching method with a high degree of precision.

At the next stage, a tin oxide film 3 is formed all over the main surface containing the insulating film 2 to provide a semiconductor composite. This is accomplished by first heating the semiconductor substrate 1 to about 500°C in a quartz reaction tube and then introducing a vapor containing tin into said reaction tube to have a tin oxide film 3 deposited by pyrolysis on the substrate 1. For this reason, dimethyl tin dichloride ( $(CH_3)_2SnCl_2$) can be used. This compound was found to be most preferable. It is, however, also possible to use an aqueous solution of tin tetrachloride ($SnCl_4$) or its solution in an organic solvent.

As carrier gas an oxydizing atmosphere such as air, oxygen can be used. The tin oxide film 3 can be deposited to a thickness of about 7,000 A by conducting said pyrolytic reaction for 60 sec. For improving the conductivity of the film 3 said reaction source material was admixed with about 0.5 wt. percent of antimony oxide ($Sb_2O_3$).

It was discovered that an N-type silicon semiconductor is a suitable material for the substrate of said composite. However, a semiconductor composite of the like rectifying characteristic was also able to be implemented with the use of P-type silicon semiconductor. In using P-type material, however, it was found to be preferable to carry out the $SnO_2$ deposition reaction at a somewhat higher temperature or to give a proper heat treatment to the composite made by $SnO_2$ deposition at the reaction temperature mentioned above. It was further discovered that composites of a similar rectifying characteristic was also able to be manufactured with Ge or GaAs as a substrate material.

Electrodes 4 and 4' are then formed on both main surfaces of the substrate as shown in FIG. 1. These electrodes 4 and 4' are formed by depositing nickel by a vacuum evaporation method to a thickness of about 8,000 A.

A power source 6 is connected through an ammeter 7 between electrodes 4 and 4' so that a backward bias is supplied to the barrier of the composite. A pressure applying needle 5 is so provided that the tip or end thereof is in contact with the surface of the tin oxide layer 3. The pressure applying needle 5 is properly engaged in a known manner with the source of mechanical force or pressure to be measured. As the pressure applying needle 5 was used a glass rod with a radius of curvature at the top of about 100$\mu$. Alternatively, a rod of other material such as a metal or in a different form may be used.

It was discovered that there exists a roughly linearly proportional relationship between the mechanical force applied by the pressure applying needle 5 to the barrier and the backward current through the semiconductor composite, when the voltage of the power source 6 is set at a given level. The present invention utilizes this phenomenon.

Figure 3:
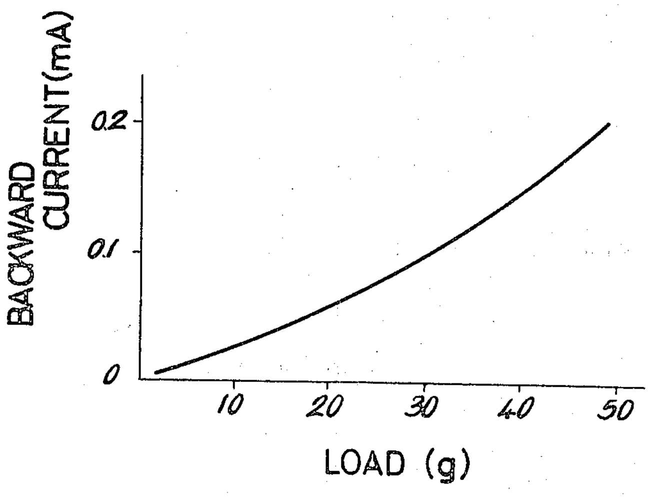
FIG. 3 is a graph showing the mechanical-electrical conversion characteristic of the semiconductive transducer of FIG. 1.

Referring to FIG. 3, there is shown a graph showing a pressure-backward current characteristic of the transducer of FIG. 1. More particularly, it is a graph showing the pressure-backward current characteristic of said transducer when a backward bias of 1 volt is given between the electrodes 4 and 4'. As may be apparent from the curve of the graph, this transducer is well satisfactory in sensitivity and has a relatively good linearity. Though it is advisable to have the pressure applying needle 5 set near the centre of the barrier region formed by the substrate 1 and the tin oxide film 3, there is a wide choice of its location. A well stabilized characteristic can be provided in view of the high hardness of the tin oxide film 3, which ensures non-deformation of the film in use for a long period.

As may be apparent from the above explanation, the pressure sensitive element in accordance with the present invention is easy to make, excellent in a pressure sensitive characteristic and, therefore, is highly useful in applications such as an acoustical pick-up.

Figure 4:
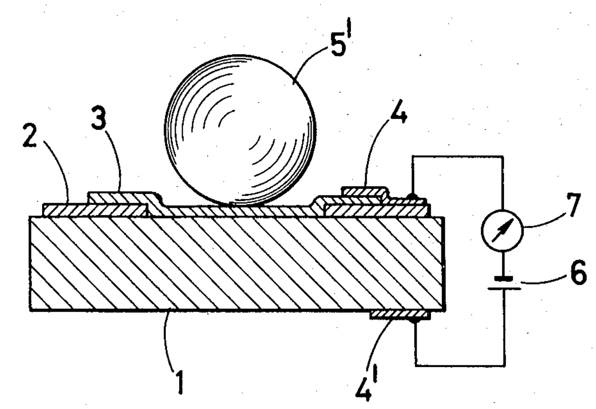
FIG. 4 is a sectional view of a semiconductive transducer of another embodiment in accordance with the present invention.

Referring to FIG. 4, there is shown a sectional view of a transducer of another embodiment in accordance with the present invention, wherein is used a pressure applying ball 5' in place of the pressure applying needle 5. As may be seen from FIG. 1, with a pressure applying needle 5 the pressure to which the barrier is subjected may vary according to the direction of vector of the mechanical force applied to the pressure applying needle 5. According to the embodiment of FIG. 4, however, the pressure applying ball 5' is allowed to roll and hence the pressure can be applied vertically to the surface of tin oxide where the ball comes into contact with the tin oxide surface even if the direction of the mechanical force applied to the pressure applying ball 5' is not vertical to the tin oxide surface.

The characteristic shown in FIG. 3 was that of the embodiment in which the surface of the substrate of the semiconductor composite of the transducer of FIG. 1 was mirror-polished. In fact, in case of the photosensitive semiconductor composite disclosed in the prior applications referred to in the section "Description of the Prior Art," mirror-polishing of the surface of the substrate was considered desirable. It was, however, discovered that in the light of the purpose of the present invention it is preferable to leave the substrate surface of the inventive transducer rough or uneven. Given below is a detailed description of such an embodiment of the present invention.

Figure 5:
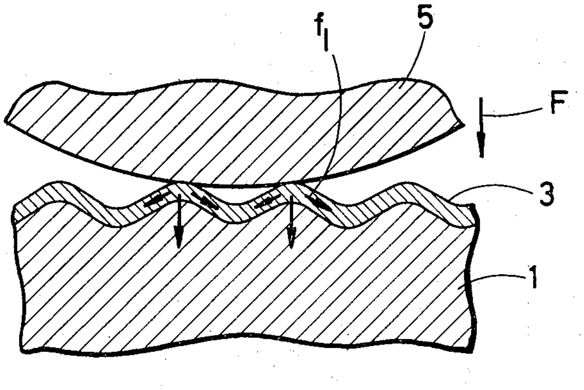
FIG. 5 is an enlarged sectional view of a portion where the pressure applying means is in contact with the semiconductor composite of still another embodiment in accordance with the present invention.

Referring to FIG. 5, there is shown an illustrative enlarged sectional view of the pressure applying needle contact area of such an embodiment where the substrate surface of the transducer of FIG. 1 is left rough or uneven. A main surface of the semiconductor substrate 1 is full of unevenness and the tin oxide film 3 is deposited over this uneven surface. Therefore, when a proper pressure applying member such as the pressure applying needle 5 with a radius of curvature at the tip of 100$\mu$ is allowed to press on the tin oxide film 3, the pressure applying needle 5 partially comes into contact with protruded portions of the tin oxide film 3. When a load is applied to pressure applying needle 5, a mechanical strain is given rise to in a part of the tin oxide film 3 and the semiconductor substrate 1, and this strain has influence on the abovementioned barrier, which can be detected as a change of backward current through the barrier by means of a suitable detective means such as the ammeter 7 connected in series with the backward bias power source 6, as illustrated in FIG. 1.

It was discovered that the pressure sensitive device of the embodiment of FIG. 5, in which the abovementioned construction is employed, was distinguished for its remarkably improved pressure sensitive characteristic.

Figure 6:
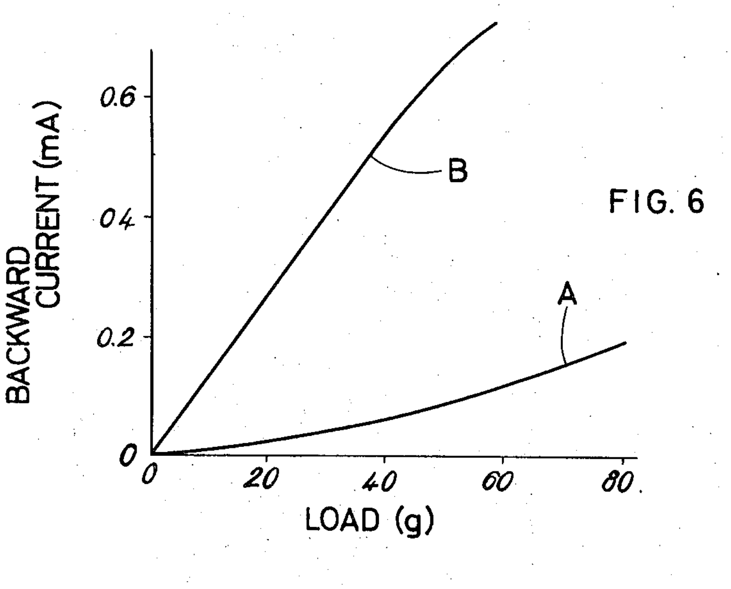
FIG. 6 is a graph showing comparison of the mechanical-electrical conversion characteristic of the transducer of FIG. 1 with that of the transducer of FIG. 5.

FIG. 6 is a graph showing a change of the backward current (amperage) against the load applied as determined with the embodiment of FIG. 5. In this figure, Curve A is a characteristic curve of the pressure sensitive device of the embodiment with the substrate surface mirror-polished which was referred to above in connection with FIG. 1, while Curve B is that showing a characteristic of the pressure sensitive device of the embodiment of FIG. 5.

With the pressure sensitive device of the embodiment with its substrate surface mirror-polished, the tin oxide film was deposited on the mirror-polished main surface of semiconductor substrate such as normally employed in a common semiconductor device like a diffusion-type transistor. On the contrary, no complicated process is required for providing unevenness on the semiconductor substrate such as of the embodiment of FIG. 5.

While normally the semiconductor substrate used in a diffusion type semiconductor device is mirror-polished after lapping, the semiconductor substrate for the embodiment of FIG. 5 can be prepared without said mirror-polishing. Only if needed, it may as well be mirror-polished and then subjected to chemical etching. The surface of the semiconductor substrate thus prepared has many small concaves and convexes to a depth or height of about 1 micron and spaced apart several microns from each other. As the pressure applying needle 5 was used a chromium-plated needle, and the abovementioned characteristic was obtained with the bias voltage of 5 V.

Such a remarkable difference in pressure sensitive characteristic as shown in FIG. 6 is attributable to the difference in surface condition of the substrate on which the tin oxide film is deposited. The reason may be explained as follows.

It is presumed that the load applied gives rise to a shearing stress in the barrier region of the composite, this shearing stress affecting the rectifying barrier. Referring to FIG. 5, load F applied to the pressure applying needle 5 causes a component $f_1$ of the force to act along with a direction of a bevel of the tin oxide film 3, this giving rise to a shearing stress in the barrier in the bevel portion. This shearing stress is more important than the compressive stress vertical to the barrier in respect of influence on the barrier. One of the reasons may be accounted for by, among others, the fact that shearing modulus is smaller than Young's modulus. The relationship between shearing modulus $n$ and Young's modulus E is expressed as follows:

$$N = [E/2 ( 1 + K ) ]$$

where $K$ is Poisson's ratio, which is normally about 0.3 for metals and the like. Therefore, the shearing modulus is only about 0.4 times that of Young's modulus. This means that under a given load, the deformation by shearing is more than that by compression. Another reason lies in the fact that the semiconductor composite contained in the transducer of the present invention comprises the heterojunction between two different kinds of materials such as semiconductor and tin oxide. The tin oxide film 3 is deposited through pyrolysis on the semiconductor substrate 1. Hence, the mechanical adherence of the film to the substrate is not so strong as in the case of a junction between the same materials. Moreover, the semiconductor substrate 1 and the tin oxide film 3 are sufficiently hard and small in shearing modulus. Therefore, when the component $f_1$ of force is allowed to be applied to the tin oxide film 3 along the direction of a bevel, shearing takes place between the tin oxide film 3 and the semiconductor substrate 1 without being accompanied by deformation of the tin oxide film 3 and the semiconductor substrate 1, this influencing the rectifying barrier. As will be described later, the slope of the bevel of the irregularities or unevenness in the surface the of semiconductor substrate 1 is so easy that the component $f_1$ of load F which acts along the direction of the bevel of the tin oxide film 3 is presumed to be rather small. Nevertheless, a remarkable improvement in pressure sensitive characteristic can be achieved with such a minute component $f_1$ of force. This fact substantiates the usefulness of the present invention. Thus, it is seen that the said latter reason is more significant. Generally speaking, it is difficult to provide sharp irregularities in the surface of the semiconductor substrate. For instance, by employing a common method of selective chemical etching for making grooves on the substrate, the largest possible angle of the groove wall or bevel to the main surface of the substrate is only 30°–45°. Even if sharper irregularities could be provided by some other means, it is difficult to have the tin oxide film deposited by pyrolysis on such steep walls of grooves.

As will be apparent from the above description, the semiconductor pressure sensitive device of the embodiment of FIG. 5 makes good use of the heterojunction between the semiconductor substrate and the tin oxide film so that the said junction is subjected to shearing stress by adoption of such a construction that a force as a component of the load applied is allowed to act in the extending direction of the tin oxide film. Such transducer is simple in construction and easy to manufacture.

Figure 7:
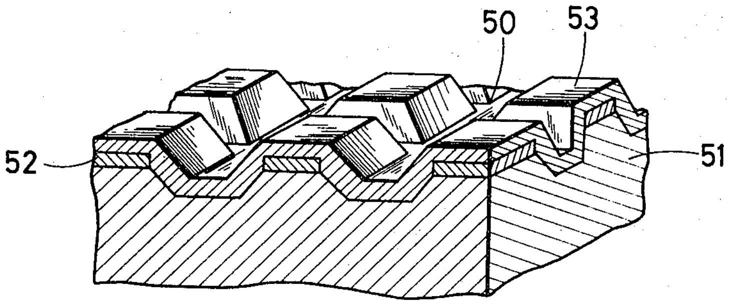
FIG. 7 is an enlarged perspective view of a fragmentary part of the transducer of still another embodiment in accordance with the present invention.

FIG. 7 is an enlarged perspective view of a fragmentary part of another embodiment of the present invention similar to the embodiment of FIG. 5. Referring to FIG. 7, grooves 50 are formed latticewise on the main surface of a semiconductor substrate 51 and on the outermost plane surface other than the grooves 50 is deposited an insulating film 52. A tin oxide film 53 is then deposited all over the main surface of the substrate including the grooves 50 and the insulating film 52. The grooves 50 may, as mentioned above, be easily formed by chemical etching. The insulating film 52 may, for example, be a film of silicon nitride. When silicon nitride film is employed, it may be utilized as a mask for selective formation by etching of the grooves 50. In this embodiment the insulating film 52 is sandwiched so as not to provide the heterojunction just where shearing stress does not take place, or compressive stress takes place. In view of this the proportion of the shearing stress area to the entire area of the heterojunction is enhanced, this bringing about further improvement of the pressure sensitive characteristic.

Now referring again to FIG. 1, the embodiment shown therein has the electrode 4 formed only over the peripheral portion of the tin oxide film 3. It is, therefore, apparent that the barrier of the semiconductor composite employed in the transducer of FIG. 1 is exposed to incidental light. As mentioned in the section of "Description of the Prior Art," the semiconductor composite contained in the transducer of FIG. 1 can be used as a desirable photoelectric device. Hence, by so adapting the transducer shown in FIG. 1 that light is applied to said barrier through the tin oxide film, a semiconductive transducer converting light energy as well as mechanical force into electrical energy is provided. Such novel transducer may provide new applications.

In some applications, however, a transducer not sensitive to incidental light but responsive only to mechanical force may be called for. In such cases it is even necessary to avoid influence of the variation of intensity of light from outside on the pressure sensitive characteristic of the transducer.

Figure 8:
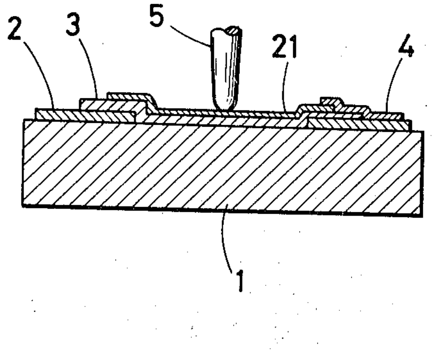
FIG. 8 is a sectional view of the transducer of a further embodiment of the present invention.
Figure 9:
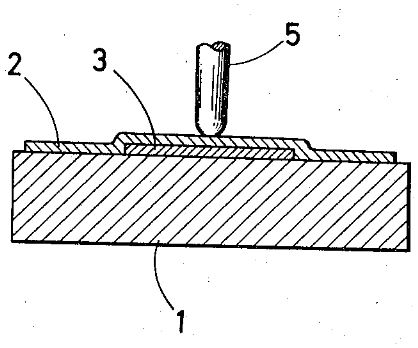
FIG. 9 is a sectional view of the transducer of still a further embodiment in accordance with the present invention, FIG. 10 ia a top view of a further embodiment in accordance with the present invention.

FIG. 8 is a sectional view of the transducer of a further embodiment of the present invention intended for such purpose. Referring to FIG. 8, an opaque protective film 21 of, e.g., nickel is deposited on the tin oxide layer 3 so as to be in contact with the electrode 4. Since the incidental light directed to the barrier is screened by the protective film 21, it is not necessary to have the entire device shown housed in a casing made of opaque material. The protective nickel film 21 also serves as an electrode. Nickel, however, is low in hardness and hence when load is applied by means of the pressure applying member, it undergoes plastic deformation, this resulting in an unstabilized pressure sensitive characteristic. Therefore, it is advisable to choose a material of high strength for the light screen. As such a material for the thin film 21 meeting the abovementioned requirement may be recommended molybdenum, tungsten, platinum and chromium. This film must be thick enough to effect screening of light, but is desired to be as thin as possible, the recommended thickness being, for instance, $0.1\mu$ or so. Alternatively, a metal oxide such as alumina may be used. The abovementioned thin film 21 which acts as screen against the incidental light also serves for protection against damage to tin oxide layer or barrier as incurred by the pressure applying needle.

Where the thin-film 21 is to serve as such protective film, it may as well be made of silicon dioxide or silicon nitride. FIG. 9 shows a sectional view of the transducer of an embodiment of the present invention in which the protective film is made of silicon dioxide. The transducer of the embodiment shown in FIG. 9 is made by first depositing the tin oxide layer 3 in a defined area and then depositing silicon dioxide film 2 on and around the tin oxide layer 3 so that the tin oxide layer 3 is protected by the latter film where it comes into contact with the pressure applying needle and at the same time the exposed portion of the barrier along the rim of the tin oxide layer is covered and protected.

Figure 10:
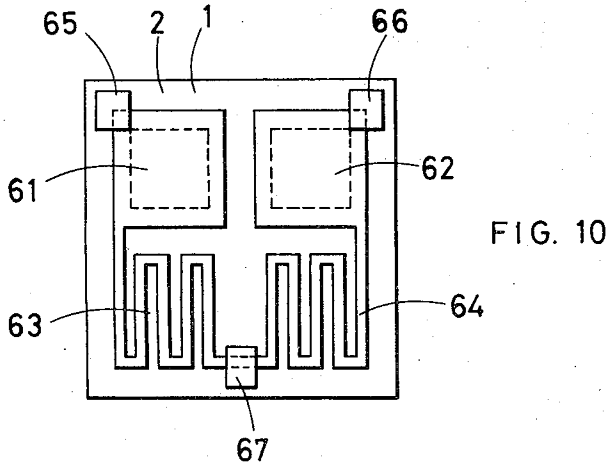

In FIG. 10 is shown a top view of still another embodiment of the present invention, which comprises two transducers 61 and 62 separately formed on a common substrate 1 and two resistors 63 and 64 connected to the said two transducers, respectively. Illustration of the pressure applying means is omitted for clarity. More specifically, an insulating layer 2 of such material as silicon dioxide is deposited on a common substrate 1 and in the insulating layer 2 of the transducer region are provided two openings through which the substrate 1 is exposed. Such openings are shown in FIG. 10 in dotted lines. Over said openings are deposited tin oxide for providing two transducers 61 and 62. The tin oxide layer, as to be shown in more detail in FIG. 10, extends on the insulating layer 2 in a thin meandering strip, this acting as a resistor of predetermined value. Terminals or electrodes 65, 66 and 67 are provided as shown in the figure. Another terminal or electrode (not shown) is provided on the substrate 1. As may be easily understood, the transducers 61 and 62 and resistors 63 and 64 constitute a so-called bridge circuit and, therefore, minute difference between the mechanical forces applied to transducers 61 and 62 can be detected with high sensitivity. For instance, when a bar of a balance is borne in such a manner that it applies pressure to said transducers 61 and 62, the balance of the scale is detected with high sensitivity.

Another application of interest of the embodiment shown in FIG. 10 will be described in the following. The electrodes 65 and 66 are connected in series to any suitable AC voltage source and two mechanical force applying means are provided on the transducers 61 and 62, respectively, both means being engaged with a single common mechanical force is equally applied to both transducers. Thus, both transducers or diodes, when each is regarded as a diode in view of the rectifying characteristic, are connected in series but in an opposite direction. For a given half cycle of the alternate current, pressure applied to the transducers gives rise to a change of the backward current flowing through one transducer, while a forward current flows through the other transducer and vice versa. The resultant alternate current flowing through both transducers is proportional to the force applied to both transducers. Alternately of the AC voltage source in the foregoing description, it would be possible to use a DC voltage source, the polarity of which is randomly or regularly switched.

Figure 11:
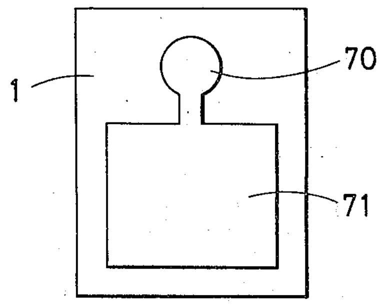
FIG. 11 is a top view of still another embodiment in accordance with the present invention.

In FIG. 11 is shown a top view of a transducer of still a further embodiment of the present invention. This embodiment comprises transducer 70 which responds to the pressure applied thereto and transducer 71 which responds to incident light, both transducers 70 and 71 being formed in the common substrate 1. In the figure, illustration of the pressure applying means is omitted for clarity. The tin oxide layer forming both transducers 70 and 71 is continuous and hence these two transducers 70 and 71 constitute a single transducer. Thus the embodiment shown in FIG. 11 provides a transducer responsive to both pressure and incidental light.

Figure 12:
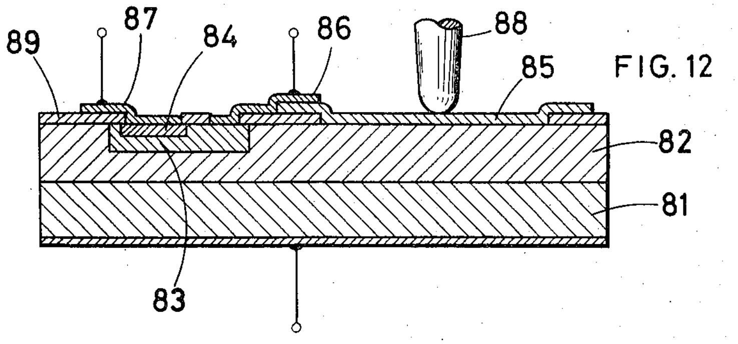
FIG. 12 is a sectional view of yet another embodiment in accordance with the present invention.

Referring to FIG. 12, there is shown a sectional view of a transducer of a further embodiment of the present invention, which comprises the combination of a pressure sensitive transducer in accordance with the present invention and a transistor. Referring more specifically to FIG. 12, the embodiment is implemented with a substrate comprising the combination of an N+ layer 81 and an N-type layer 82 formed thereon, this substrate having a transistor formed in the left half thereof. This transistor comprises the N-type layer 82 as a collector, a P-type layer 83 as a base and an N-type layer 84 as an emitter. In the figure is also shown a silicon dioxide layer 89 which is formed while said transistor is provided by a known planar method. The electrode 87 for the emitter 84 and the electrode 86 for the base 83 are provided by a known method. In producing the transducer shown, first the transistor is formed on the substrate as described above and then the pressure sensitive transducer according to the present invention is provided, the reason being that the transducer can be made by processing at a relatively low temperature, while the preparation of the transistor calls for processing at a high temperature such as selective diffusion. On the right half of the substrate shown is formed a pressure sensitive transducer, this transducer comprising the substrate 82, the tin oxide film 85 and the pressure applying means 88.

As described more fully in connection with the embodiment of FIG. 1, the transducer in accordance with the present invention is superior to the known types of transducer in pressure sensitive characteristic and it alone can give satisfactory result in many applications. However, in some applications where a still higher pressure sensitivity is required, the embodiment shown in FIG. 12 may prove advantageous.

While specific preferred embodiments of the invention have been described, it will be apparent that obvious variations and modifications of the invention will occur to those of ordinary skill in the art from a consideration of the foregoing description. It is, therefore, desired that the present invention be limited only by the appended claims.

What is claimed is:

1. A semiconductive mechanical-electrical transducer comprising:
- a semiconductor composite including a semiconductor substrate formed of Si, Ge, or GaAs; and a film of tin oxide deposited on said semiconductor substrate and forming a barrier having a rectifying characteristic therebetween; and
- means for applying mechanical force to said composite.

2. A semiconductive transducer according to claim 1, in which said semiconductor is Si.

3. A semiconductive transducer according to claim 2, in which said semiconductor is N-type conductivity Si.

4. A semiconductive transducer according to claim 1, which further comprises means for providing a reverse bias potential to said semiconductor composite.

5. A semiconductive transducer according to claim 1, in which said mechanical force applying means is in a form of a rod, the end of which is in contact with said tin oxide film.

6. A semiconductive transducer according to claim 1, in which said mechanical force applying means is in a form of a ball, a portion of which is in contact with said tin oxide film.

7. A semiconductive mechanical-electrical transducer, comprising:
- a semiconductor composite including a semiconductor substrate having a main surface, a film of insulating material formed on a portion of the main surface of said substrate, and a tin oxide film deposited on the remaining, exposed portion of the main surface of said substrate as defined by said film of insulating material, whereby a barrier having a rectifying characteristic is formed between said substrate and said tin oxide film, and
- a means for applying mechanical force to said semiconductor composite.

8. A semiconductive transducer according to claim 1, which further comprises a protection film deposited on said tin oxide film.

9. A semiconductive transducer accoding to claim 8, in which said protection film is so hard as to protect the tin oxide film from damage caused by mechanical force applying means.

10. A semiconductive transducer according to claim 8, in which said protection film is opaque.

11. A semiconductive transducer according to claim 8, in which said protection film is transparent.

12. A semiconductive mechanical-electrical transducer comprising:
- a semiconductor composite including a semiconductor substrate formed of Si, Ge, or GaAs; and a film of tin oxide deposited on a main surface of said semiconductor substrate and forming a barrier having a rectifying characteristic therebetween;
- means for applying mechanical force to said composite, and
- wherein the main surface of the substrate and the tin oxide film are so constructed that a shearing stress is applied to the barrier portion formed therebetween as a function of the force exerted by the mechanical force applying means.

13. A semiconductive mechanical-electrical transducer comprising:
- a semiconductor composite including a semiconductor substrate formed of Si, Ge, or GaAs; and a film of tin oxide deposited on a main surface of said semiconductor substrate and forming a barrier having a rectifying characteristic therebetween;
- means for applying mechanical force to said composite, and
- wherein the main surface of the substrate and the tin oxide film are so constructed that a shearing stress is applied to the barrier portion formed therebetween as a function of the force exerted by the mechanical force applying means, in which said barrier is uneven.

14. A semiconductive mechanical-electrical transducer comprising:
- a semiconductor composite including a semiconductor substrate formed of Si, Ge, or GaAs; and a film of tin oxide deposited on a main surface of said semiconductor substrate and forming a barrier having a rectifying characteristic therebetween;
- means for applying mechanical force to said composite, and
- wherein the main surface of the substrate and the tin oxide film are so constructed that a shearing stress is applied to the barrier portion formed therebetween as a function of the force exerted by the mechanical force applying means, in which the main surface comprises a projection including top and bevel portions thereof and at said top of which is deposited an insulation layer and the tin oxide film is deposited on the main surface of the substrate, whereby the barrier having a rectifying characteristic is formed in a bevel portion of the projection.

15. A semiconductive mechanical-electrical transducer comprising:
- a semiconductor composite including a semiconductor substrate formed of Si, Ge, or GaAs; and at least two discrete tin oxide layers deposited on said substrate, whereby at least two semiconductor composites with corresponding separate barriers are formed therebetween, each having a separate rectifying characteristic, and
- means for applying mechanical force to said composite.

16. A semiconductive mechanical-electrical transducer comprising:
- a semiconductor composite including a semiconductor substrate formed of Si, Ge, or GaAs having at least two discrete tin oxide layers deposited on said substrate, whereby at least two semiconductor composites with corresponding separate barriers are formed therebetween, each having a separate rectifying characteristic, in which two separate semiconductive composites are formed and two resistors are provided, said two separate barriers and said two resistors forming a bridge circuit; and means for applying mechanical force to said composite.

17. A semiconductive transducer according to claim 16, in which an insulating layer is deposited on a main surface of the substrate, and said resistors comprise a tin oxide layer formed extending over said insulating layer.

18. A semiconductive mechanical-electrical transducer for converting mechanical and light energy, comprising:

a semiconductor composite including a semiconductor substrate formed of Si, Ge, or GaAs; and a film of tin oxide deposited on said semiconductor substrate and forming a barrier having a rectifying characteristic therebetween, means for applying mechanical force to said composite, and wherein said semiconductor composite is so adapted that incidental light is applied to said barrier.

19. A semiconductive mechanical-electrical transducer comprising:

a semiconductor composite including a semiconductor substrate formed of Si, Ge, or GaAS; and a film of tin oxide deposited on said semiconductor substrate and forming a barrier having a rectifying characteristic therebetween, means for applying mechanical force to said composite, and wherein a semiconductive active device is formed in said substrate for cooperating with said semiconductor composite.

20. A semiconductive mechanical-electrical transducer, comprising:

a semiconductor composite including:

a semiconductor substrate having an uneven main surface, and a film of tin oxide deposited on said uneven main surface so as to form an uneven heterojunction barrier having rectifying characteristics therebetween, whereby a force exerted against said barrier surface produces a shearing stress in the heterojunction, and means for applying a mechanical force to said composite.

21. A semiconductor mechanical-electrical transducer according to claim 20, wherein said main surface of the substrate has a plurality of grooves therein rendering it uneven, further comprising:

an insulating layer on the portions of said main surface exclusive of the grooves, and said tin oxide film being deposited on both the insulating layer and the grooves in the main surface of the substrate, whereby a heterojunction barrier having rectifying chracteristics is formed within the grooves in the substrate.

22. A semiconductor mechanical-electrical transducer as claimed in claim 20 wherein the main surface of the substrate comprises natural surface irregularities unaltered by polishing.

23. A semiconductor mechanical-electrical transducer as claimed in claim 20 wherein the main surface of the substrate comprises a lapped but unpolished surface.

24. A semiconductor mechanical-electrical transducer as claimed in claim 23 wherein the means for applying mechanical force comprises a pressure applying needle having a radius of curvature at the tip of about 100 microns.

25. A semiconductor mechanical-electrical transducer as claimed in claim 20 wherein the main surface of the substrate comprises a polished semiconductor surface, made uneven by chemical etching.

* * * * *

UNITED STATES PATENT OFFICE
CERTIFICATE OF CORRECTION

Patent No. 3,872,490 Dated March 18, 1975

Inventor(s) Kazuhiro Higashi et al.

It is certified that error appears in the above-identified patent and that said Letters Patent are hereby corrected as shown below:

Column 1, line 12, "transdusers" should read -- transducers --. Column 4, line 29, change the period (.) after "graph" to a comma -- , --. Column 5, line 48, "top" should read -- tip --. Column 8, line 7, "the of" should read -- of the --. Column 13, line 28, "GaAS" should read -- CaAs --.

Signed and sealed this 15th day of July 1975.

(SEAL)
Attest:

RUTH C. MASON
Attesting Officer

C. MARSHALL DANN
Commissioner of Patents
and Trademarks